United States Patent [19]
Krett et al.

[11] Patent Number: 5,115,203
[45] Date of Patent: May 19, 1992

[54] DIGITAL POWER AMPLIFIER

[75] Inventors: David L. Krett, Springville; Timothy L. Kean, Cedar Rapids, both of Iowa

[73] Assignee: Rockwell International Corporation, El Segundo, Calif.

[21] Appl. No.: 543,281

[22] Filed: Jun. 25, 1990

[51] Int. Cl.$^5$ .............................................. H03F 3/217
[52] U.S. Cl. .................................. 330/251; 330/207 A
[58] Field of Search ............... 330/10, 51, 207 A, 251, 330/252, 277, 295; 307/494; 455/114

[56] References Cited

U.S. PATENT DOCUMENTS

| | | | |
|---|---|---|---|
| Re. 33,333 | 9/1990 | Taylor, Jr. et al. | 330/10 |
| 4,748,421 | 5/1988 | Schilling et al. | 330/251 |
| 4,764,734 | 8/1988 | Schilling et al. | 330/251 |

FOREIGN PATENT DOCUMENTS 0044144  4/1977  Japan ................................... 330/251

*Primary Examiner*—Steven Mottola
*Attorney, Agent, or Firm*—John J. Horn; M. Lee Murrah; H. Fredrick Hamann

[57] ABSTRACT

A wideband high efficiency amplification system for amplifying radio frequency signals to high power levels. The system includes components adapted for generating an RF carrier signal having a multi-level waveform which may be characterized as a "modified square wave" including one or more intermediate voltage levels. This RF carrier waveform allows the power of the signal to be amplified with high efficiency beyond the efficiency levels which can ordinarily be achieved with conventional wideband class D amplifiers. The preferred embodiment of the invention describes an amplification system generating and using a three level waveform although waveforms having more than three levels may also be used.

11 Claims, 5 Drawing Sheets

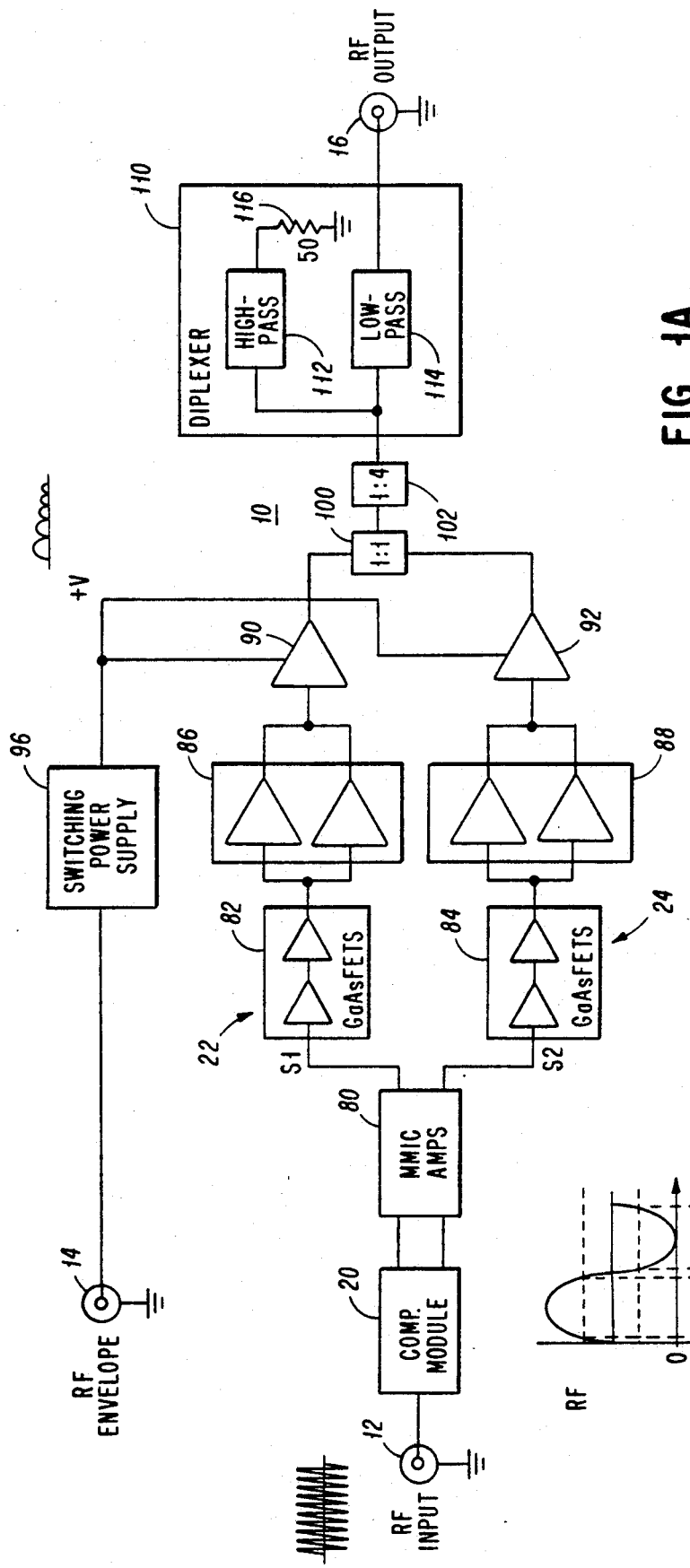
FIG 1A
FIG 1B
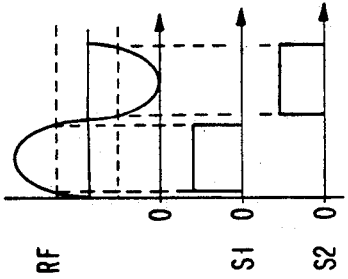

DIGITAL POWER AMPLIFIER

BACKGROUND OF THE INVENTION

The present invention relates to power amplifiers for use in radio transmitters and more particularly to high efficiency amplifiers suitable for use in high power applications.

It is important for power amplifiers used in radio transmitters to be as efficient as possible in order to reduce amounts of wasted energy and minimize the requirements for cooling associated with these amplifiers. In particular, high efficiencies have been achieved in the past through the use of "class D" type amplifiers in which the RF carrier assumes a bi-level square wave shape with the signal voltage alternating between high and low voltage levels. This wave shape allows the efficiency of the amplifier to be increased since it limits the extent to which the amplification devices are simultaneously subject to substantial amounts of voltage potential and current flow. Unfortunately, this waveshape is also associated with significant amounts of high frequency harmonics which in wideband applications must be filtered off prior to the signal being supplied to the antenna for broadcast, leading to the dissipation of appreciable amounts of energy.

In an alternative to class D operation, sometimes referred to as "class G" operation, amplifiers are constructed using separate transistors connected to separate power supplies which are coupled together so as to be independently operative during different parts of the RF carrier cycle. However, in class G operation the transistors operate in the linear mode producing a continuous sine wave type output which is therefore subject to the same type of efficiency limits (although to a lesser degree) as class B amplifiers. Class D and class G amplifiers are naturally limited in efficiency by their inherent designs and the waveshapes of the carrier signals which they amplify. More specifically, these amplifiers are theoretically limited to efficiencies no higher than approximately 70% in the case of class G amplifiers and approximately 81% in the case of wideband type class D amplifiers.

It is therefore an object of the present invention to provide a wideband amplification system for use at high power levels having the highest possible efficiency.

It is another object of the present invention to provide a wideband power amplifier in which the waveshape of the RF carrier is optimized for high efficiency and the harmonics content associated with the wave shape is minimized prior to filtering.

It is a further object of the present invention to produce a high power and high efficiency wideband amplification system which is relatively simple and economic to construct yet is capable of achieving theoretical efficiencies greater than 90%.

SUMMARY OF THE INVENTION

The present invention constitutes a high efficiency wideband power amplification system suitable for amplifying radio frequency signals to high power levels appropriate for broadcast purposes. The system includes components adapted for generating an RF carrier signal having a multi-level waveform which may be characterized as a "modified square wave" including one or more intermediate voltage levels. This RF carrier waveform allows the power of the signal to be amplified with especially high efficiency through the use of amplification circuitry such as GaAs MESFET and high power MOSFET transistors. The preferred embodiment of the invention describes an amplification system generating and utilizing a three level waveform. However, waveforms having more than three levels may be readily utilized as illustrated in the alternative embodiment and such waveforms may allow even higher efficiency levels to be achieved.

In the preferred embodiment, a comparator module including two differential amplifiers is used to process a sine wave type RF exciter signal into two separate pulse trains corresponding to intervals when the voltage of the RF signal is resident either above or below prescribed levels substantially removed from the zero potential level. The resulting pulse trains are amplified along separate channels including MESFET and MOSFET transistor devices and combined in the outputs of the final amplification stage. The carrier signal is modulated through control of the supply voltages to the MOSFET transistors in the final amplification stage. The modified square wave output of the final amplification stage is supplied to a diplexer which filters the signal to remove unwanted harmonics which constitute a lower percentage of the energy of the signal on account of the unique wave shape.

BRIEF DESCRIPTION OF THE DRAWINGS

FIG. 1A is an overall block diagram of an amplification system adapted for generating and amplifying modified square wave signals of the type shown in FIG. 1B in accordance with the present invention.

DESCRIPTION OF THE PREFERRED EMBODIMENT

Referring now to FIG. 1A and 1B, a high power wideband high amplification system 10 which is adapted for operation in the HF frequency band receives a low power RF input signal on the coaxial terminal 12, an RF envelope or amplitude control signal containing information to be transmitted on the coaxial terminal 14 and provides a high power RF output signal modulated in accordance with the envelope information on the coaxial terminal 16. In accordance with well known principles, the RF input signal serves as a carrier for the envelope information which is capable of being broadcast over substantial geographic distances. However, the amplification system 10 features a unique waveform for the RF carrier signal which allows the amplification system 10 to operate at high efficiency levels compared to conventional high power amplification systems.

Figure 2:
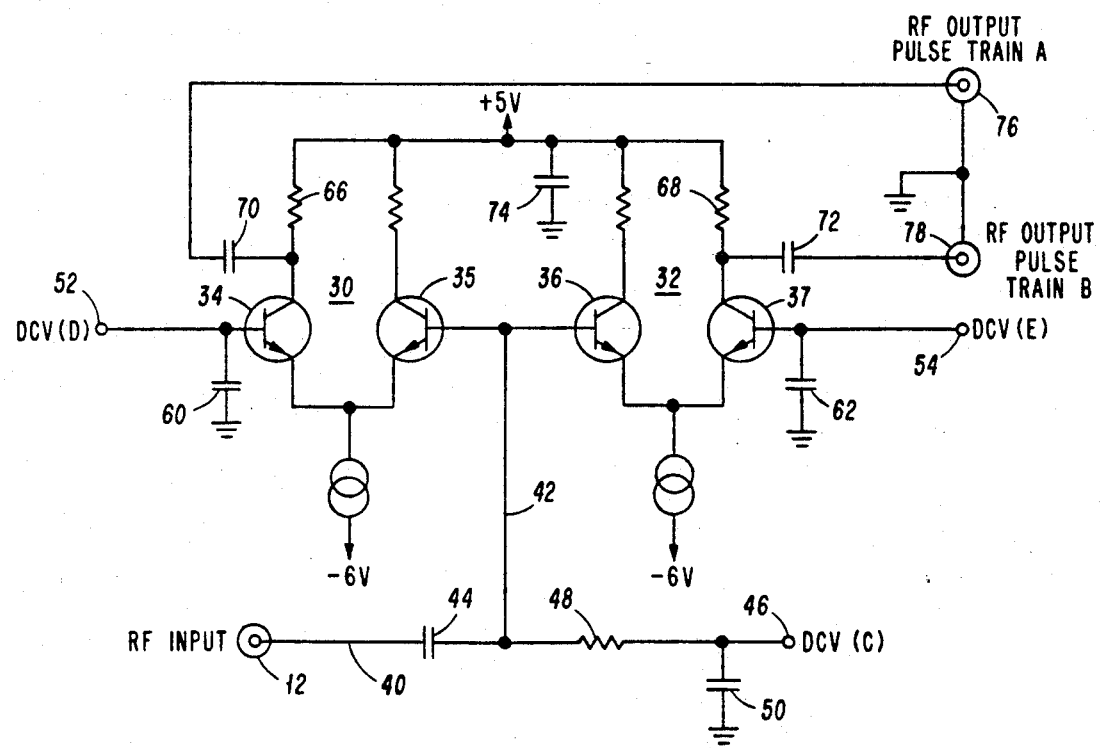
FIG. 2 is a schematic circuit diagram of the comparator module component of the amplification system shown in FIG. 1.

The comparator module 20 receives the RF input signal which comprises a HF sine wave of constant amplitude, frequency and phase from an exciter (not shown) and transforms this signal into a pair of pulse trains which are then transmitted and amplified along two separate signal channels 22 and 24 and subsequently recombined to form the final output signal. It should be noted that the RF input signal may be of varying phase if the amplification system 1 is used in conjunction with an EER (envelope elimimination and restoration) scheme for linearizing the power amplifier. Referring now to FIG. 2, the comparator module 20 comprises a pair of differential amplifiers 30 and 32 including bipolar transistors 34 and 35 associated with the differential amplifier 30 and bipolar transistors 36 and 37 associated with the differential amplifier 32. The RF input signal from the terminal 12 is transmitted along the lines 40 and 42 through the DC blocking capacitor 44 to the bases of the transistors 35 and 36. A positive DC voltage C which is adjusted to be equal to one-half of the peak-to-peak voltage of the RF input signal is applied to the terminal 46 and transmitted through the resistor 48 in order to provide a DC level on which the RF input signal rides as it is applied to the bases of the transistors 35 and 36. The capacitor 44 blocks the DC voltage on the terminal 46 from affecting the RF input while the capacitor 50 shunts RF signal energy to ground before it can affect the power supply providing the DC voltage on the terminal 46. The resistor 48 merely acts as a RF load of appropriate impedance (e.g. 50 ohms) for generating the maximum voltage drop from the RF input signal.

Constant DC voltages D and E are applied to the terminals 52 and 54 and transmitted to the bases of the transistors 34 and 37, respectively. The DC voltage D is selected to be approximately 69.71 percent of the peak-to-peak voltage of the RF input signal and the DC voltage E is selected to be approximately 30.28 percent of the peak-to-peak voltage of the RF input signal in order to provide pulse trains on both of the channels 22 and 24 which have approximately 37.1% duty cycles. The capacitors 60 and 62 are operative for shunting RF energy to ground so that it may not affect the power supply. The desired pulse train signals are generated on the collectors of the transistors 34 and 37 as the RF input signal goes above and below the levels of the DC voltages D and E applied to the terminals 52 and 54. The resistors 66 and 68 provide the required voltage drops as the transistors 34 and 37 turn on during operation of the module 20. The capacitors 70 and 72 block any DC voltages which may be present on the collectors of the transistors 34 and 37 from reaching the RF output terminals 76 and 78 while the capacitor 74 shunts any RF energy which may precede past the resistors on the collectors of the transistors 34, 35, 36 and 37 to ground before it can affect the power supply.

The RF output terminals 76 and 78 supply the signal channels 22 and 24 with the RF pulse train signals A and B, respectively. These pulse train signals are amplified to broadcast power levels as they are passed through several different amplification stages featuring different solid state amplification devices. In the first of such stages the pulse trains are subject to substantial voltage amplification as they are passed through separate sets of broadband MMIC amplifiers 80 comprising, for example, four darlington connected pairs of bipolar transistors with resistive feedback such as MAR-2 amplifiers as manufactured by Mini-Circuits of Brooklyn, N.Y. The first two amplifiers in these sets provide linear amplification increasing the voltage and power of the pulse train signals while the following two amplifiers operate at saturation for improving the rise and fall time of the signals. The MMIC amplifiers 80 increase the power of the pulse train signals A and B from approximately 25 microwatts to approximately 8 milliwatts while helping to "square off" the waveforms of the signals.

Thereafter, the pulse train signals from the MMIC amplifiers 80 are provided to separate sets of GaAsFET amplifiers 82 and 84 which provide approximately 20 dB of gain and amplify the power levels of the pulse train signals up to approximately one watt. The GaAsFET amplifiers 82 and 84 are high band devices which provide substantial gain without distortion of RF signals such as ATF-45101 and ATF-44101 gallium arsenide Shottkey-barrier gate MESFET amplifiers as manufactured by Avantek of Santa Clara, Calif.

The pulse train signals which are output from the GaAsFET amplifiers 82 and 84 along the channels 22 and 24 are then passed to two sets of prefinal MOSFET amplifiers 86 and 88 each such as MRF161 RF TMOS transistors as manufactured by Motorola of Phoenix, Ariz. The MOSFET amplifiers 86 and 88 include two separate transistor devices which are connected in parallel and amplify the incoming pulse train signals from approximately one watt of power per channel to approximately 14 watts of power per channel.

The pulse train signals which are output from the prefinal amplifiers 86 and 88 are then supplied to final amplifiers 90 and 92 which amplify the power of the signals on each of the channels 22 and 24 to approximately the 200 watt level into the range desired for broadcast purposes. The final amplifiers 90 and 92 comprise high-power MOSFET devices such as MRF150 RF TMOS transistors as manufactured by Motorola of Phoenix, Ariz. Amplitude control of the RF pulse trains is provided by means of variation of the power supply voltage coupled to the drain elements of the amplification devices. Pursuant to this function, the envelope signal provided on the coaxial input 14 is supplied to a switching power supply for generation of a power supply 96 voltage variable in accordance with the audio information carried by the signal. The envelope information is impressed on the RF pulse trains A and B traveling down the channels 22 and 24 by means of the power supply voltages supplied to the amplifiers 90 and 92.

The pulse train outputs of the final amplifiers 90 and 92 are subsequently combined in a balun 100 and fed to an impedance matching transformer 102 suitable for coupling the amplification stages to an antenna. However, prior to supply to the coaxial terminal 16 the signals from the transformer 102 are passed through a diplexer 110 including high pass and low pass filters 112 and 114. The low pass filter 114 is configured to pass signals within the frequency range of the original RF input while the high pass filter 112 is configured to pass harmonics of the original RF input signal which are generated pursuant to the amplification process and its associated wave shaping functions to a dump resistor 116. The unique wave shape of the modified square wave signal of the present invention allows a minimum of power to be lost in the diplexer 110 because the wave shape includes a reduced harmonic content.

Figure 3:
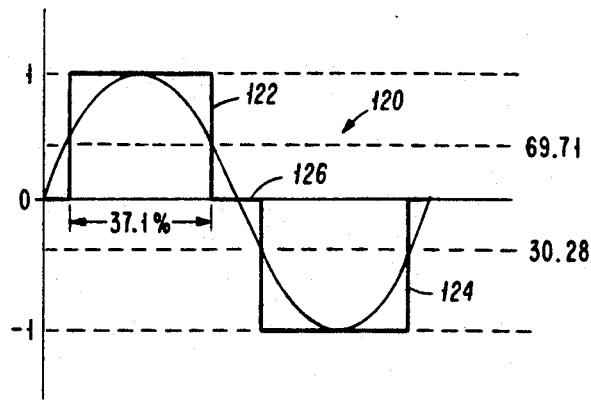
FIG. 3 is a drawing of the waveshape of the modified square wave signal produced by the amplification system shown in FIG. 1A (prior to filtering) in accordance with the present invention.

Referring now to FIG. 3, the final product of the amplification system 10 prior to diplexer 110 is a signal in the form of a modified square wave 120 including alternate positive and negative pulses 122 and 124 having approximately 37.1% duty cycles and including a zero potential level at which the signal is resident approximately 25.8% of the time during each cycle. The modified square wave shown in FIG. 3 allows for a theoretical efficiency in wideband applications of approximately 92% as compared with a theoretical efficiency of approximately 81% for a traditional class D type amplifiers. The benefits of such an efficiency increase are substantial in that not only are power losses significantly reduced but also the required heat sinks and cooling structures may be downsized.

Figure 4:
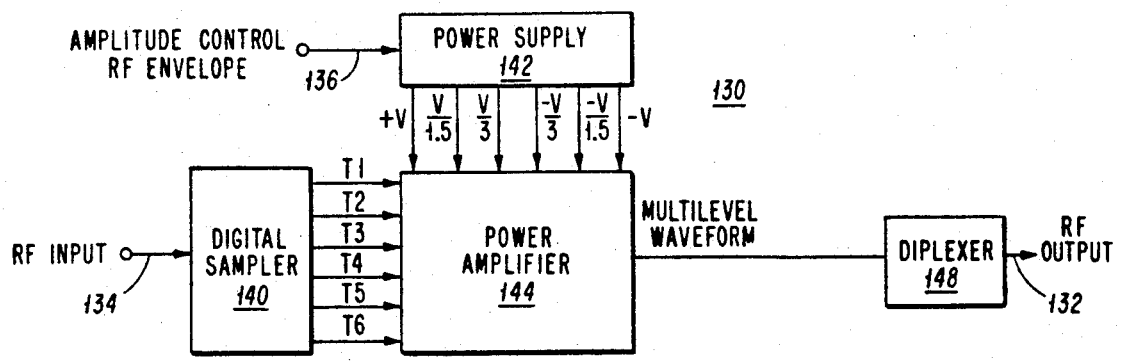
FIG. 4 is an overall block diagram of a 6-level amplification system adapted for producing a modified square wave signal in accordance with the present invention.

Referring now to FIG. 4, an alternative embodiment of the present invention comprises an amplification system 130 which is illustrative of waveform generation techniques in accordance with the present invention and which is adapted for operation in the LF frequency band and provides an RF output on the line 132 in response to an RF input on the line 134 and an amplitude control input on the line 136. The amplification system 130 includes a digital sampler 140 which generates switching signals T1-T6 in response to the RF input which correspond to intervals in which the RF input signal is resident between prescribed voltage limits. A power supply 142 provides a set of supply voltages at different levels which are all uniformly variable in accordance with the audio input provided to the power supply 142. A power amplifier 144 synthesizes a multi-level square wave type signal using voltages supplied by the power supply 142 selected in accordance with the switching signals T1-T6. It should be noted that the amplification circuitry shown is relatively low power but that appropriate drivers and high power devices could be readily added in accordance with conventional techniques to increase the power of the amplifier 144. A diplexer 148 filters off unwanted harmonics prior to the signal being output from the system 130.

Figure 5:
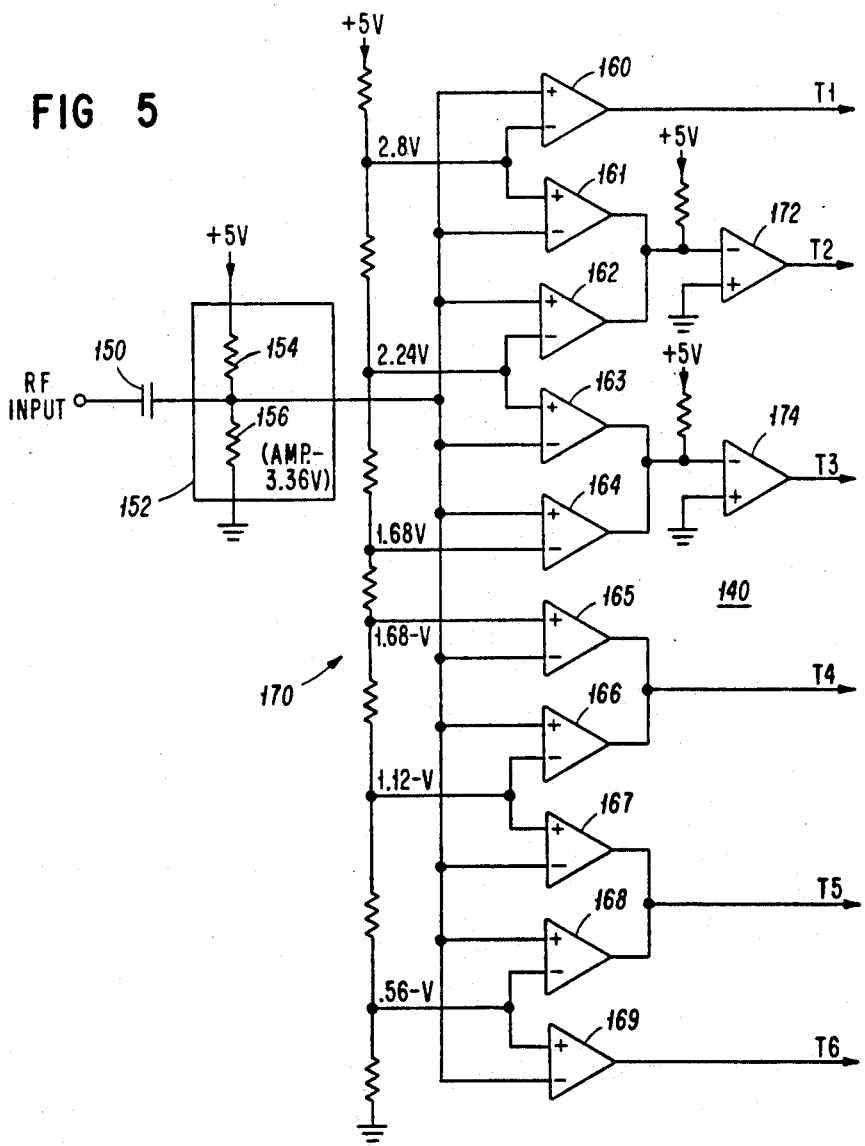
FIG. 5 is a schematic diagram of the digital sampler component of the amplification system shown in FIG. 4.
Figure 6:
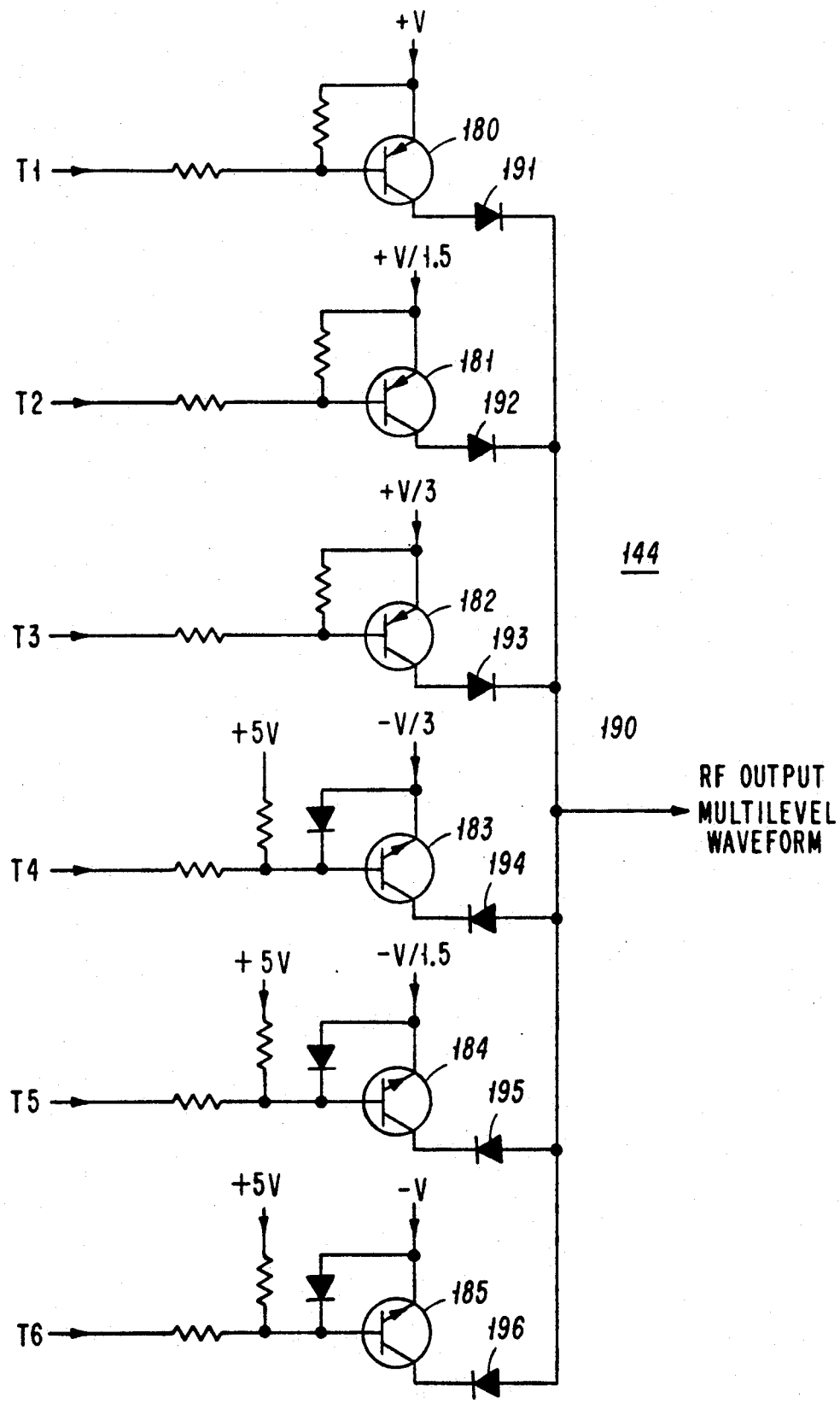
FIG. 6 is a schematic circuit diagram of the power amplifier component of the amplification system shown in FIG. 4.

Referring now to FIG. 5, the RF input signal is coupled through the capacitor 150 which blocks unwanted DC components and is supplied to the level shifting network 152. The network 152 includes two resistors 154 and 156 connected between a constant power supply voltage and ground which operate to furnish a DC level selected to shift the RF input signal so that its lowest value is at the zero potential level. The level shifted R input signal output from the network 152 is supplied to the comparators 160-169 which also receive constant reference voltages from a resistive ladder 170 constructed in accordance with well known principles. The comparators 160 and 169 turn "on" when the RF input voltage rises above a specified level or falls below a specified level, respectively. The pairs of comparators 161 and 162, 163 and 164, 165 and 166, and 167 and 168 operate cooperatively and function as window comparators turning "on" during intervals when the RF input voltage is between prescribed limits defining contiguous ranges with respect to the RF input signal. Since the comparators 160-169 are arranged in open collector configurations their operation reflects the circuitry connected to their output terminals comprising primarily the power amplifier 144 shown in FIG. 6. The comparators 172 and 174 are provided for inverting the signals generated by the comparators 161, 162, 163 and 164 in order to supply "negative going" pulses to the power amplifier 144 as required for its proper operation. The signals T1-T6 comprise pulses which correlate with the intervals during which the RF input signal is resident within the prescribed voltage ranges.

Figure 7:
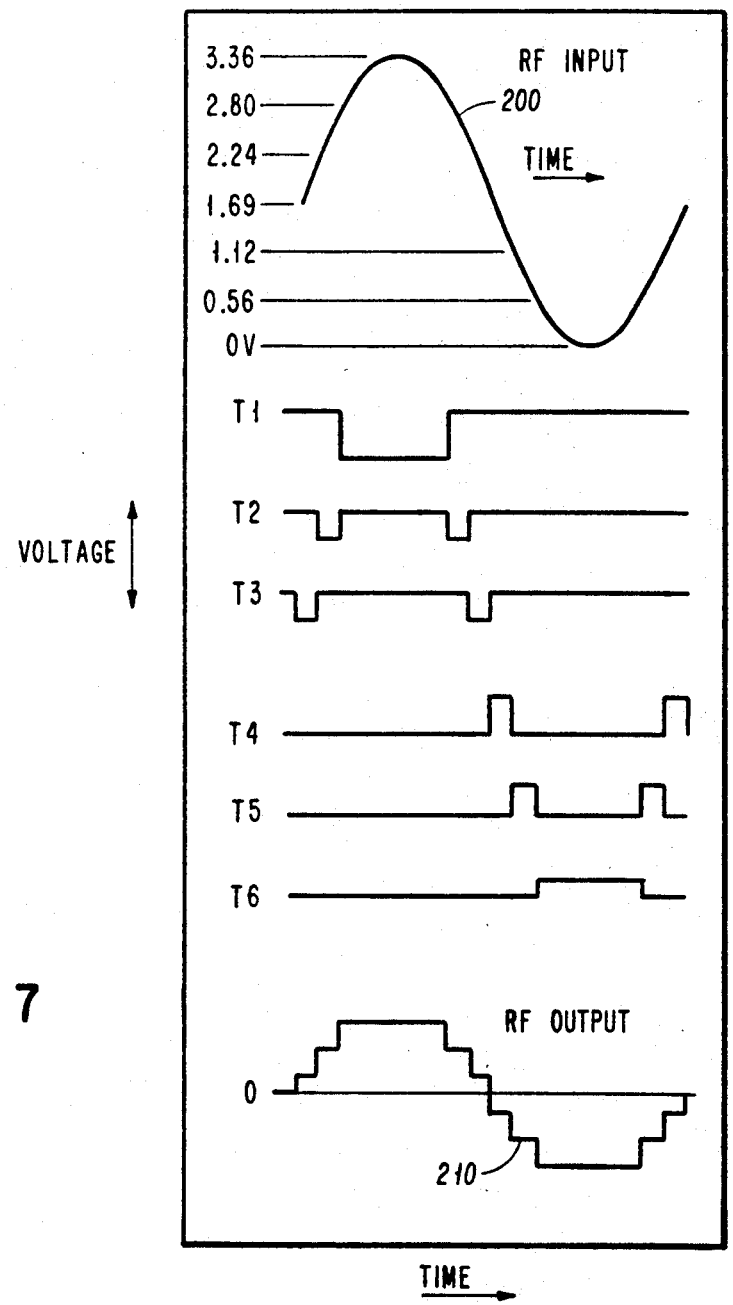
FIG. 7 is a timing diagram showing various waveforms characteristic of the amplification system shown in FIG. 4 illustrating the temporal coordination between these signals.
Figure 8:
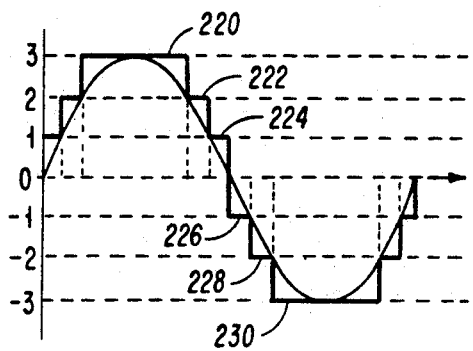
FIG. 8 is a drawing of the waveshape of the modified square wave signal produced by the amplification system shown in FIG. 4 in accordance with the present invention.

The power amplifier 144 includes a set of transistors 180-185 of which the transistors 180-182 are of the PNP type and the transistors 183-185 are of the NPN type. The switching signals T1, T2 and T3 shown in FIG. 7 turn on the transistors 180, 181 and 182, respectively, whenever these signals assume their low voltage states thereby connecting the supply voltages V, V/1.5 and V/3 to the output line 190. The switching signals T4, T5 and T6 also shown in FIG. 7 turn on the transistors 183, 184 and 185 whenever they assume their high voltage states thereby connecting the supply voltages −V/3, −V/1.5 and −V to the output line 190. It should be understood that the variations in construction between the circuitry surrounding the transistors 180-182 and the transistors 183-185 are due to the fact the transistors 180-182 are providing positive voltage levels to the output line 190 while the transistors 183-185 are providing negative voltage levels to the output line 190. The diodes 191-196 provide isolation between the output line 190 and the transistors 180-185 which is required whenever signals of opposite polarity from those provided by the transistors are on the output line 190. The transistors 180-185 respond to the signals T1-T6 to provide different voltage levels to the output line 190 which in view of the contiguous ranges which the signals T1-T6 represent with respect to the RF input signal result in sequential voltage levels being supplied to the output line 190 which are combined in the output of the power amplifier 144 to generate a multi-level waveform which steps smoothly from one level to another in accordance with the original RF input signal. As shown in FIGS. 7 and 8 the RF input signal results in an RF output signal 210 in the form of a modified square wave having multiple levels. The output waveform of the amplification system 130 includes six different levels 120, 122, 124, 126, 128 and 340 which have approximately 27%, 12%, 11%, 11%, 12% and 27% duty cycles, respectively.

The efficiency of the amplification process executed by the system 130 is greatly increased by the waveform of the carrier signal provided by the waveform synthesizer 144 to the extent that the system has a theoretical efficiency of 97% which is a substantial improvement over the 81% theoretical efficiency achievable with conventional class D power amplifiers in wideband type applications.

While particular embodiments of the present invention have been shown and described, it should be clear that changes and modifications may be made to such embodiments without departing from the true scope and spirit of the invention. It is intended that the appended claims cover all such changes and modifications.

We claim:

1. A high efficiency digital RF power amplification system, comprising:
    an exciter for providing a low power RF carrier signal;

means for converting said RF carrier signal into a modified square wave signal characterized by a RF waveform having three or more voltage levels;

a power amplifier for amplifying the power of said modified square wave signal; and a diplexer for filtering the output of said power amplifier in order to suppress high frequency harmonics.

2. A high efficiency digital RF power amplification system comprising:

an exciter for providing a low power RF carrier signal;

means for converting said RF carrier signal into a modified square wave signal characterized by a RF waveform having three or more voltage levels; and a power amplifier for amplifying the power of said modified square wave signal which includes a pair of gallium arsenide field effect transistors of the same conductivity type which are connected in a push-pull configuration.

3. A process for increasing the efficiency of an RF digital power amplifier comprising the step of:

converting the RF carrier signal to be amplified by said power amplifier into a modified square wave signal having an RF waveform including three or more voltage by comparing said RF carrier signal to fixed voltage thresholds using comparators installed on separate signal channels in order to generate separated pulse trains which may be combined to produce said modified square wave signal.

4. The process of claim 3, in which said modified square wave includes a single intermediate voltage level at the zero potential level.

5. The process of claim 4, in which said modified square wave is at zero potential for approximately 25.8% of the time during each RF cycle.

6. The process of claim 3, further including the step of amplifying the power of said modified square wave signal using a pair of GaAs field effect transistors of the same conductivity type which are connected in a push-pull confirmation.

7. A high efficiency digital RF power amplification system, comprising:

means for generating a low power RF carrier signal;

first comparator means for comparing said RF carrier signal to a first voltage level in order to produce a first pulse train having substantially less than a 50% duty cycle;

second comparator means for comparing said RF carrier signal to a second voltage level in order to produce a second pulse train having less substantially less than a 50% duty cycle;

means for amplifying the power of RF signals; and means for separately combining said pulse trains to form an RF signal having a multilevel waveform.

8. The power amplification system of claim 7, wherein said first and second comparator means comprise differential amplifiers.

9. The power amplification system of claim 7, wherein said first and second pulse trains have approximately 37% duty cycles.

10. The power amplification system of claim 7, further including a set of GaAsFET amplifiers for amplifying the power of said pulse train signals.

11. The power amplification system of claim 10, further including a diplexer for filtering the output of said power amplification system in order to suppress high frequency harmonics.

* * * * *